Feb. 25, 1964

AKIHIKO SATO ETAL

METHOD OF PRODUCING IMPROVED ALLOYED SILICON-ALUMINUM P-N JUNCTIONS

Filed Oct. 25, 1960

INVENTORS
A. Sato
Y. Moriguchi
by Greene, Pineles & Durr
ATTORNEYS

United States Patent Office 3,122,460
Patented Feb. 25, 1964

3,122,460

METHOD OF PRODUCING IMPROVED ALLOYED SILICON-ALUMINUM P-N JUNCTIONS

Akihiko Sato and Yoshiro Moriguchi, Tokyo, Japan, assignors to Nippon Electric Company Limited, Tokyo, Japan, a corporation of Japan Filed Oct. 25, 1960, Ser. No. 64,825
Claims priority, application Japan Oct. 28, 1959
2 Claims. (Cl. 148—185)

This invention relates to semi-conductor devices operating with diode or P–N junctions formed with a silicon-aluminum alloy, and to the methods of producing the same. Semi-conductor devices operating with silicon diode junctions formed with a silicon-aluminum alloy have long been known, being described, for instance, in the article by Pearson and Sawyer, entitled "Silicon P–N Junction Alloy Diodes," published in the Proceedings of the Institute of Radio Engineers, December 1955, pages 1348–1351. Because of their superior temperature characteristics, they have been widely used in low-frequency transistor applications. However, known silicon diode junctions formed with an aluminum alloy are mechanically weak because of the great difference of thermal expansion coefficient between the silicon crystals, of about $4\times10^{-6}$, and that of the eutectic silicon-aluminum alloy crystals, of about $2\times10^{-5}$.

Among the objects of the invention are such semi-conductor devices having at their junction interfaces, junction strata formed of very fine crystals which raise the mechanical strength of their P–N junctions to a multiple of the strength exhibited by heretofore known junctions of this type. In accordance with the invention, semi-conductor devices with silicon diodes having a silicon-aluminum diode junction, are given greatly increased junction strength, by embodying in the molten silicon-aluminum alloy with which it is formed, a minute amount of a phosphor addition having the property of producing a solidified P–N junction formed of very minute crystals, which gives such P–N junctions several orders of greater strength than obtainable with heretofore known P–N junctions of this type. The phosphor addition should be 0.005% to 0.1% of the SiAl alloy with which the P–N junction is formed. (Throughout the specification and claims, all proportions are given by weight unless otherwise specifically stated.) Best results are obtained by embodying 0.08% of phosphorus in the SiAl alloy.

Figure 1:
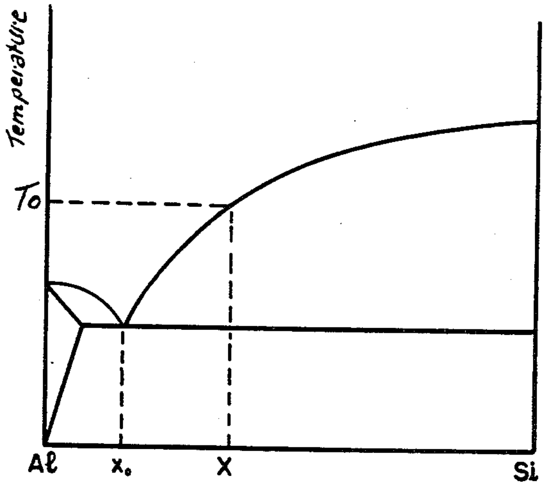
Figure 1:
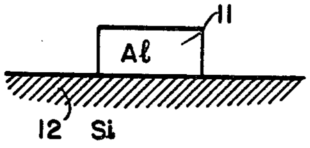
Figure 1:
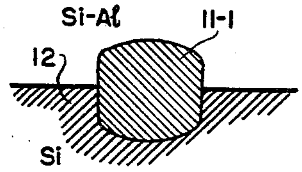
Figure 1:
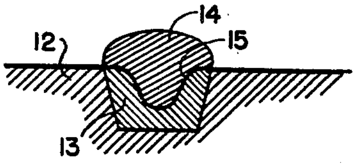

The foregoing objects and other objects of the invention will be best understood from the following description of an exemplification thereof, reference being had to the accompanying drawing, wherein:

FIG. 1 is a binary phase diagram of the SiAl system; and

FIGS. 2–A, 2–B and 2–C show diagrammatically, by way of example, successive stages in a process used in producing a silicon diode P–N junction in accordance with the invention.

Referring to FIG. 2–A, to produce a silicon P–N junction alloy diode, a small, dot-like body portion 11 of aluminum is placed on a crystal portion or crystal plate 12 of silicon of the required degree of purity. Upon heating the silicon plate 12 and the aluminum body portion 11 thereof to temperature $T_o$ of the phase diagram of FIG. 1, of the SiAl system, all of the aluminum 11 and adjacent body portion of the silicon plate 12 are molten, yielding a silicon-aluminum solution, as indicated at 11–1 in FIG. 2–B, of the composition corresponding to point $x$ on the composition axis of the diagram of FIG. 1. When the temperature of the silicon plate and the molten silicon-aluminum alloy portion 11–1 held thereon, as seen in FIG. 2–B, is gradually lowered below $T_o$, some of the silicon content of the molten silicon-aluminum alloy will re-crystalize along the facing surface of the silicon plate 12, as shown at 13 in FIG. 2–C, until at the eutectic point corresponding to the eutectic composition $X_o$ on the composition axis, there is finally crystallized the eutectic SiAl composition indicated at 14 in FIG. 2–C. The interface or boundary 15 between the re-crystallized silicon crystal body 13 (FIG. 2–C) and the crystallized SiAl eutectic alloy 14, provides the P-N diode junction. The P-N junctions of heretofore known silicon diodes of the type described, are mechanically weak, and it is believed that the weakness of the junction is due to the great difference in the thermal expansion coefficient between the re-crystallized silicon and the crystallized SiAl alloy body portions which form the P-N junction.

In accordance with the invention, the mechanical strength and thermal-shock resistance of known silicon-SiAl alloy diode junctions is strengthened by several orders of magnitude, by embodying in the molten SiAl alloy with which the junction is formed, a minute amount of phosphorus constituting 0.005% to 0.1% of the SiAl alloy, thereby causing the re-crystallized primary crystals of Si and the crystallized SiAl eutectic crystals at the P-N junction boundary to be extremely fine or minute, and giving the junction such greater strength.

Although the thermal coefficient of expansion of the eutectic composition SiAl differs greatly from that of Si crystals ($2\times10^{-5}$ for SiAl and $4\times10^{-6}$ for Si), the strain energy at their P-N junction boundary is absorbed by the fine crystalline surfaces of the minute, fine crystals which have been formed at the junction by the small phosphor addition embodied in the molten SiAl alloy with which the junction is formed. Good results are obtained with a phosphorus addition from 0.005% to 0.1% of the SiAl alloy with which the P-N junction is formed. Best results are obtained by embodying in the SiAl alloy, about 0.08% of phosphorus.

Although the distribution coefficient of phosphorus is 0.35, and is about 100 times greater than that of aluminum, which is 0.004, the phosphorus embodied in the SiAl molten mixture is so minute as to remove any possibility of the phosphor reversing the conductivity characteristics of the SiAl alloy junction body portion. The phosphorus required for producing the superior silicon P-N diode junction of the invention, may be embodied in or alloyed with the aluminum body used for forming the P-N junction, or placed thereon either before melting it, or after it is molten, in the manner described above. Alternatively, the surface of the N-type silicon crystal body portion 12, may be doped with the required small amount of phosphorus. In such case, a suitable value for the specific resistance of the silicon base plate 12 is chosen, and it is doped with N-type impurities in an amount sufficient to compensate for minute amounts of the P-type impurities required for obtaining the desired high-stability silicon P-N alloy diode having thermal-shock resistance and mechanical strength at the interface of the P-N junction formed between the silicon plate and the solidified SiAl alloy portion.

It will be apparent to those skilled in the art that the novel principles of the invention disclosed herein in connection with a specific exemplification thereof, will suggest various modifications and applications of the same. It is accordingly desired that in construing the breadth of the appended claims, they shall not be limited to the specific exemplification of the invention described above.

We claim:

1. The method of providing a semi-conductor device with a P-N junction formed with an N-type silicon body and a silicon-aluminum alloy comprising providing an N-type silicon wafer; placing on said N-type silicon wafer an aluminum alloying dot containing by weight a phosphorus addition of from 0.005% to 0.1% of the SiAl alloy with which the P-N junction is formed; heating the silicon body with the aluminum alloying dot held in contact therewith to form out of the heated aluminum a molten silicon-aluminum alloy; and thereafter cooling the silicon body with the molten alloy body to solidification until there is formed a solidified P-N junction between the silicon and a solidified eutectic SiAl alloy body portion containing the phosphorus addition.

2. The method of providing a semi-conductor device with a P-N junction formed with an N-type silicon body and a silicon-aluminum alloy comprising providing an N-type silicon wafer; providing aluminum on said N-type silicon body; heating the silicon body with the aluminum held in contact therewith to form out of the heated aluminum a molten silicon-aluminum alloy; adding an amount of phosphorus from an external source to said molten aluminum, said amount being from 0.005% to 0.1% by weight of the SiAl alloy with which the P-N junction is formed; cooling the silicon body with the molten alloy body to solidification until there is formed a solidified P-N junction between the silicon and a solidified eutectic SiAl alloy body portion containing the phosphorus addition.

References Cited in the file of this patent

UNITED STATES PATENTS

| | | |
|---|---|---|
| 1,940,922 | Sterner-Rainer | Dec. 26, 1933 |
| 2,878,432 | Armstrong et al. | Mar. 17, 1959 |

FOREIGN PATENTS

| | | |
|---|---|---|
| 537,909 | Canada | Mar. 5, 1957 |
| 792,172 | Great Britain | Mar. 19, 1958 |
| 814,406 | Great Britain | June 3, 1959 |